(12) United States Patent
Cui et al.

(10) Patent No.: US 10,044,001 B2
(45) Date of Patent: Aug. 7, 2018

(54) DISPLAY SUBSTRATE AND MANUFACTURING METHOD THEREFOR, AND DISPLAY DEVICE

(71) Applicant: BOE Technology Group Co., Ltd., Beijing (CN)

(72) Inventors: Ying Cui, Beijing (CN); Chunjing Hu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/321,211

(22) PCT Filed: Apr. 12, 2016

(86) PCT No.: PCT/CN2016/079038
§ 371 (c)(1),
(2) Date: Dec. 22, 2016

(87) PCT Pub. No.: WO2016/188248
PCT Pub. Date: Dec. 1, 2016

(65) Prior Publication Data
US 2017/0194602 A1    Jul. 6, 2017

(30) Foreign Application Priority Data
May 28, 2015    (CN) .......................... 2015 1 0283539

(51) Int. Cl.
*H01L 51/52* (2006.01)
*H01L 27/32* (2006.01)
*H01L 51/56* (2006.01)

(52) U.S. Cl.
CPC ...... *H01L 51/5271* (2013.01); *H01L 27/3246* (2013.01); *H01L 27/3283* (2013.01); *H01L 51/56* (2013.01); *H01L 2227/323* (2013.01)

(58) Field of Classification Search
CPC ............. H01L 27/3246; H01L 27/3283; H01L 51/5271; H01L 51/56
See application file for complete search history.

(56) References Cited

U.S. PATENT DOCUMENTS 7,482,696 B2 * 1/2009 Shei ........................ H01L 33/60
257/678
9,620,487 B2 * 4/2017 Sakariya ............. H01L 25/0753
(Continued)

FOREIGN PATENT DOCUMENTS

| CN | 101026180 A | 8/2007 |
| CN | 103681769 A | 3/2014 |

(Continued)

OTHER PUBLICATIONS

Jul. 15, 2016—(CN) International Search Report and Written Opinion Appn PCT/CN2016/079038 with English Tran.
(Continued)

*Primary Examiner* — Mark Tornow
(74) *Attorney, Agent, or Firm* — Banner & Witcoff, Ltd.

(57) ABSTRACT

Provided are a display substrate and a manufacturing method therefor, and a display device. The display substrate includes: a base substrate, a pixel defining layer (40, 40') formed on the base substrate, and a light emitting layer located in a sub-pixel region (P) defined by the pixel defining layer (40, 40'), wherein, the pixel defining layer (40, 40') includes: a reflecting layer (41, 41'), configured such that light emitted from the light emitting layer to the reflective layer (41, 41') is reflected to a light outgoing side of the display substrate. The display device adopting the display substrate not only can effectively solve the problems of light leakage and light color interference, but also can effectively improve light out-coupling efficiency and color purity.

18 Claims, 2 Drawing Sheets

(56) References Cited

U.S. PATENT DOCUMENTS

| | | | |
|---|---|---|---|
| 2008/0194054 A1* | 8/2008 | Lin | H01L 25/0753 438/64 |
| 2012/0043565 A1* | 2/2012 | Sagawa | H01L 27/3211 257/89 |
| 2012/0326188 A1* | 12/2012 | Han | H01L 33/60 257/98 |
| 2014/0217431 A1 | 8/2014 | Aoyagi et al. | |
| 2015/0014636 A1* | 1/2015 | Kang | H01L 51/5253 257/40 |

FOREIGN PATENT DOCUMENTS

| | | |
|---|---|---|
| CN | 103915482 A | 7/2014 |
| CN | 104282844 A | 1/2015 |
| CN | 104465706 A | 3/2015 |
| CN | 104466022 A | 3/2015 |
| CN | 104979375 A | 10/2015 |
| KR | 20150004974 A | 1/2015 |

OTHER PUBLICATIONS

Jun. 16, 2017—(CN) Office Action Appn 201510283539.7 with English Translation.
Jan. 25, 2018—(CN) Second Office Action Appn 201510283539.7 with English Tran.

* cited by examiner

DISPLAY SUBSTRATE AND MANUFACTURING METHOD THEREFOR, AND DISPLAY DEVICE

The application is a U.S. National Phase Entry of International Application No. PCT/CN2016/079038 filed on Apr. 12, 2016, designating the United States of America and claiming priority to Chinese Patent Application No. 201510283539.7 filed on May 28, 2015. The present application claims priority to and the benefit of the above-identified applications and the above-identified applications are incorporated by reference herein in their entirety.

TECHNICAL FIELD

Embodiments of the present disclosure relate to a display substrate and a manufacturing method therefor, and a display device.

BACKGROUND

An Organic Light Emitting Diode (OLED) display is regarded as a next generation of display technology, due to characteristics of fast response speed, high contrast ratio, wide viewing angle and the like.

SUMMARY

An embodiment of the present disclosure provides a display substrate, comprising: a base substrate, a pixel defining layer formed on the base substrate, and a light emitting layer located in a sub-pixel region defined by the pixel defining layer, wherein, the pixel defining layer includes: a reflective layer, configured such that light emitted from the light emitting layer to the reflective layer is reflected to a light outgoing side of the display substrate.

Another embodiment of the present disclosure provides a display device, and the display device includes the above display substrate.

Still another embodiment of the present disclosure provides a manufacturing method for a display substrate, comprising:

forming a pixel defining layer in a pixel defining region on a base substrate so as to define a sub-pixel region on the base substrate;

forming a light emitting layer in the sub-pixel region;

wherein, a pixel defining layer is formed to include a reflective layer, and the reflective layer is configured such that light emitted from the light emitting layer to the reflective layer is reflected to a light outgoing side of the display substrate.

BRIEF DESCRIPTION OF THE DRAWINGS

In order to clearly illustrate technical solutions of the embodiments of the disclosure or in the prior art, drawings needing to be used in the embodiments or in the prior art will be introduced simply. It is obvious that the described drawings are just a part of the embodiments of the present disclosure. Those skilled in the art can obtain other drawings according to the drawings without any inventive work.

DETAILED DESCRIPTION

The technical solutions of the embodiments of the present disclosure will be described in a clearly and fully understandable way in connection with the drawings in the embodiments of the present disclosure. It is obvious that the described embodiments are just a part but not all of the embodiments of the present disclosure. Based on the embodiments in the present disclosure, those skilled in the art can obtain other embodiment(s), without any inventive work, which should be within the scope of the present disclosure.

In description of the present disclosure, what needs to be understood is that, an orientation or position relationship indicated by terms "up", "down" and the like is an orientation or position relationship shown based on the drawings, just for the sake of conveniently describing the present disclosure and simplifying the description, rather than indicating or hinting that signified devices or elements must have specific orientation and are configured and operated at specific orientations, and thus cannot be understood as limitation to the present disclosure.

Figure 1:
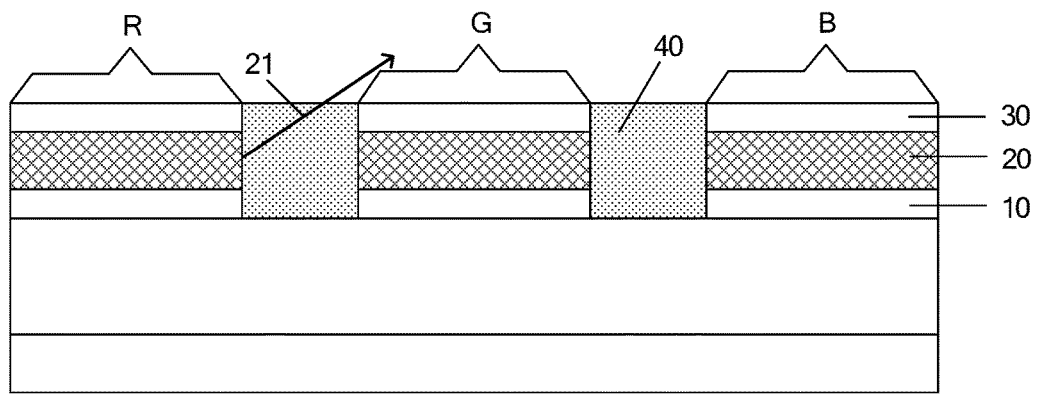
FIG. 1 is a structural schematic diagram of a base substrate of an OLED display provided in a related art.

In a related art, an OLED display includes a packaging substrate and a base substrate; the base substrate includes pixel units arranged in an array; as shown in FIG. 1, each pixel unit includes a red sub-pixel R, a green sub-pixel G and a blue sub-pixel B; each sub-pixel includes an anode 10, a light emitting layer 20 and a cathode 30. Usually, a pixel defining layer 40 is formed between adjacent sub-pixels to prevent light emitted by light emitting layers of the adjacent sub-pixels from affecting each other. However, the pixel defining layer 40 is commonly formed by a transmissive material, and lateral light emitted by the light emitting layer can be irradiated into the adjacent sub-pixels. For example, as shown in FIG. 1, lateral light 21 emitted out of the red sub-pixel R can be irradiated into the adjacent green sub-pixel G, which can result in light leakage and light color interference and decrease of a light outgoing efficiency and color purity of an OLED display device.

Although a non-transmissive material can be adopted to form the pixel defining layer in the related art, the inventors finds that the non-transmissive material is commonly a material with a low dielectric constant, which can cause decrease of photoelectric properties of elements; meanwhile, the lateral light emitted out of the light emitting layer is absorbed by the non-transmissive pixel defining layer, which still cause decrease of the light outgoing efficiency of the OLED display device. Thus, the non-transmissive material is seldom adopted to form the pixel defining layer in the related art. In that way, in a case that the transmissive material is adopted to form the pixel defining layer, to solve problems of the light leakage and the light color interference, thus improving the light outgoing efficiency and the color purity of the OLED display device, becomes a problem urgently needing to be solved.

Embodiments of the present disclosure provide a display substrate and a manufacturing method therefor, and a display device. The display device including the display substrate can effectively improve problems of light leakage and light and color interference, and a light outgoing efficiency and color purity of the display device can be effectively improved.

Figure 2:
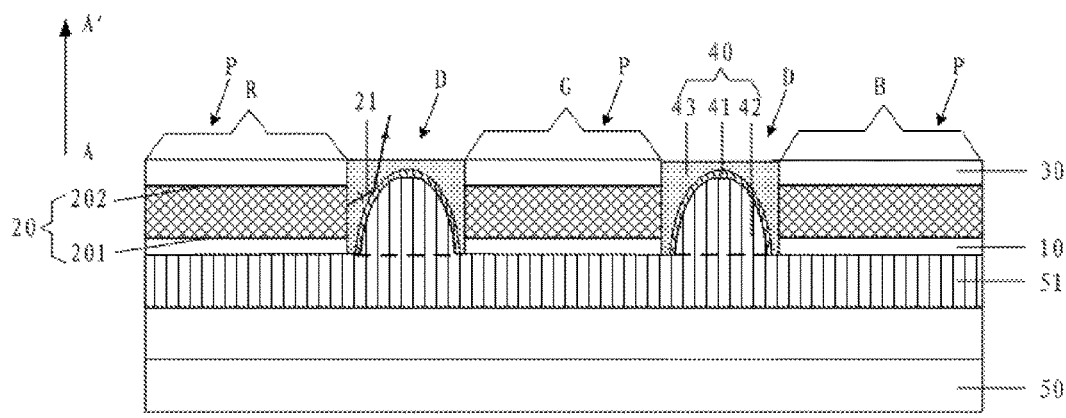
FIG. 2 is a structural schematic diagram of a display substrate provided by an embodiment of the present disclosure.
Figure 3:
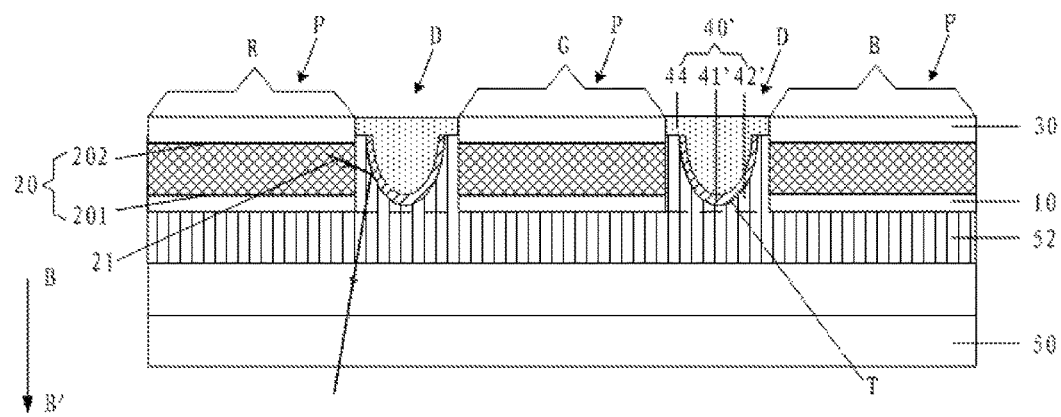
FIG. 3 is a structural schematic diagram of another display substrate provided by an embodiment of the present disclosure.

An embodiment of the present disclosure provides the display substrate, referring to FIGS. 2 to 3, the display substrate including a transparent base substrate 50, pixel defining layer 40, 40' formed on the transparent base substrate 50, and a light emitting layer 20 located in a sub-pixel region P defined by the pixel defining layer 40, 40', wherein, the pixel defining layer 40, 40' includes: a reflective layer 41, 41', configured such that light emitted from the light emitting layer 20 to the reflective layer 41, 41' is reflected to a light outgoing side of the display substrate.

In the display substrate provided by the embodiment of the present disclosure, the light emitted from the light emitting layer to the reflective layer can be reflected by the reflective layer to the light outgoing side of the display substrate, and therefore a propagation path of this part of light is changed. On one hand, the light color interference caused by this part of light on adjacent sub-pixels is avoided; on the other hand, this part of light is further irradiated to the light outgoing side of the display substrate, so that this part of light can be effectively utilized again, and the light leakage problem is effectively resolved. The above display substrate is applied into the display device, and the light outgoing efficiency and the color purity of the display device are both effectively improved.

In the above display substrate, a material of the light emitting layer is not limited in the embodiments of the present disclosure; for example, the material of the light emitting layer can be an organic electroluminescence type material and certainly can also be light emitting materials in other types. When the material of the light emitting layer is the organic electroluminescence type material, the above display substrate can form an OLED display device. The embodiments and the drawings of the present disclosure are both illustrated with that the display substrate can form the OLED display device as an example.

In a region where the pixel defining layer 40, 40' is located, a portion from the reflective layer 41, 41' to the light outgoing side of the display substrate is transparent.

The reflective layer 41, 41', protrudes towards the light outgoing side of the display substrate, and for example, the pixel defining layer 40, 40' is formed in a pixel defining region D.

In the above display substrate, the light outgoing side of the display substrate is not limited in the embodiments of the present disclosure. For example, referring to FIG. 2, the light outgoing side of the display substrate can be a surface of the display substrate away from the transparent base substrate 50, that is to say, light is emitted out from the display substrate through an upper surface of the display substrate, and the display substrate can form an OLED display device of a top emitting structure; of course, referring to FIG. 3, the light outgoing side of the display substrate can also be a lower surface of the display substrate, that is to say, light is emitted out from the transparent base substrate 50 through a lower surface thereof, and the display substrate can form an OLED display device of a bottom emitting structure. It should be noted that, in the embodiments and the drawings of the present disclosure, the upper surface of the display substrate refers to a surface away from the transparent base substrate; if the display substrate only includes a layer structure in FIG. 2, the upper surface of the display substrate is a surface composed of an upper surface of a cathode 30 and an upper surface of the pixel defining layer 40. In another example, the display substrate shown in FIG. 2 can also includes other layers, such as a protective layer, and in this case, the upper surface of the display substrate is an upper surface of the protective layer; the lower surface of the display substrate refers to the lower surface of the transparent base substrate 50. It should be understood that, in the embodiment shown in FIG. 2, the transparent base substrate 50 can also be replaced with a non transparent base substrate.

In addition, the reflective layer is in a shape of protrusion towards the light outgoing side of the display substrate. For example, in the embodiment shown in FIG. 2, the light outgoing side of the display substrate is the surface of the display substrate away from the transparent base substrate. For example, the expression that the reflective layer is in a shape of protrusion towards the light outgoing side of the display substrate refers to that the reflective layer can be in the shape of protrusion in an AA' direction; in the embodiment shown in FIG. 3, the light outgoing side of the display substrate is the lower surface of the display substrate, and the expression that the reflective layer is in a shape of protrusion towards the light outgoing side of the display substrate refers to that the reflective layer can be in the shape of protrusion in a BB' direction.

In the above display substrate, the reflective layer is configured such that light emitted from the light emitting layer to the reflective layer is reflected to the light outgoing side of the display substrate. Relative position of the reflective layer and the light-emitting layer is not particular limited in the embodiments of the present disclosure, as long as that the reflective layer can reflect the light emitted from the light emitting layer to the light outgoing side of the display substrate. For example, the reflective layer 41 can protrude out of a plane where a light emitting surface of the light emitting layer away from the light outgoing side of the display substrate is located. For example, referring to FIG. 2, the reflective layer 41 can be in the shape of protrusion in the AA' direction and protrudes out of the plane where the light emitting face of the light emitting layer 20 away from the light outgoing side of the display substrate is located, that is, the reflective layer 41 protrudes out of a plane where a lower surface 201 of the light emitting layer 20 is located. Further optionally, the reflective layer 41 can also protrude out of a plane where an upper surface 202 of the light emitting layer 20 is located so as to further improve reflectivity.

Referring to FIG. 3, the reflective layer 41' can be in the shape of protrusion in the BB' direction and protrudes out of the plane where the light emitting surface of the light emitting layer 20 away from the light outgoing side of the display substrate is located, that is, the reflective layer 41 protrudes out of a plane where the upper surface 202 of the light emitting layer 20 is located. Further optionally, the reflective layer 41 can also protrude out of the plane where the lower surface 201 of the light emitting layer 20 is located so as to further improve reflectivity. What needs to be explained herein is that, in the embodiment and the drawings of the present disclosure, the upper surface of the light emitting layer refers to a surface away from the transparent base substrate, and the lower surface of the light emitting layer refers to a surface facing the transparent base substrate.

In the display substrate, the layer structure in the sub-pixel region P defined by the pixel defining layer is not limited in the embodiments of the present disclosure. For example, referring to FIGS. 2 and 3, the sub-pixel region can also include a cathode 30 located above the light emitting layer 20 and an anode 10 located below the light emitting layer 20, and an electric field can be formed between the cathode 30 and the anode 10 to make the light-emitting layer 20 emit light; of course, positions of the cathode 30 and the anode 10 are not limited thereto, and for example, the cathode 30 can also be located below the light emitting layer 20 and the anode 10, and can also be located above the light emitting 20, which is not limited herein.

The embodiment of the present disclosure provides a display substrate, and the display substrate includes a base substrate, a pixel defining layer formed on the base substrate, and a light emitting layer located in a sub-pixel region limited by the pixel defining layer. The pixel defining layer includes a reflective layer, and the reflective layer is in the shape of protrusion towards a light outgoing side of the display substrate; in a region where the pixel defining layer is located, a portion from the reflective layer to the light outgoing side of the display substrate is transparent. In this way, referring to FIGS. 2 and 3, light 21 emitted from the light emitting layer to the reflective layer can be the reflected by reflective layer to the light outgoing side of the display substrate, and therefore a propagation path of this part of light is changed. On one hand, the light and color interference caused by this part of light on the adjacent sub-pixels is avoided; on the other hand, this part of light is further irradiated to the light outgoing side of the display substrate, so that this part of light can be effectively utilized again, and the light leak problem is effectively resolved. The above display substrate is applied into the display device, and the light outgoing efficiency and the color purity of the display device are both effectively improved.

Optionally, in order to improve reflectivity and enhance a reflecting effect accordingly, in the above display substrate, a material of the reflective layer is metal, which, for example, can be copper, aluminum, silver and the like. Of course, the material of the reflective layer can also be other materials, as long as that the material has a light reflecting characteristic.

Hereinafter, characteristics of the display substrate provided by the embodiment of the present disclosure in other aspects are further illustrated based on the display substrates shown by FIGS. 2 and 3.

Referring to FIG. 2, the display substrate includes: a transparent base substrate 50, a pixel defining layer 40 formed on the transparent base substrate 50, and a light emitting layer 20 located in a sub-pixel region P defined by the pixel defining layer 40, wherein, the pixel defining layer 40 includes: a reflective layer 41, and the reflective layer 40 is in a shape of protrusion towards a light outgoing side of the display substrate, and is configured such that light emitted from the light emitting layer to the reflective layer is reflected to the light outgoing side of the display substrate; the pixel defining part 40 further includes: a protrusion 42 located in a region where the pixel defining part 40 is located serves as a first pixel defining part, the reflective layer 41 covers whole or part of a surface of the protrusion 42, and a first transparent part 43 located above the reflective layer 41 serves as a second pixel defining part; for example, the first pixel defining part and the second pixel defining part are both made from an insulating material.

The light outgoing side of the display substrate as shown in FIG. 2 is a surface of the display substrate away from the transparent base substrate 50. The display substrate can form an OLED display device of a top emitting structure. It is understood that, in the embodiment as shown in FIG. 2, the transparent base substrate 50 can also be replaced with a nontransparent base substrate.

In the above display substrate, a material of a first transparent part 43 is not limited in the embodiments of the present disclosure. For example, the first transparent part 43 can be formed by a transparent material such as light polymerizable resin or heat polymerizable resin or other transmissive materials; a forming material of the first transparent part 43 is not specifically limited, as long as that the first transparent part is transparent.

In the above display substrate, the reflective layer 41 can cover the whole upper surface of the protrusion 42, and the reflectivity can be increased. In another embodiment, the reflective layer 41 can cover a part of the upper surface of the protrusion. The embodiment and the drawing of the present disclosure are both illustrated with that the reflective layer covers whole of the protrusion an example.

In the above display substrate, the protrusion 42 can be formed by various methods, which is not defined herein. For example, the protrusion 42 can be formed independently, or the protrusion 42 can be simultaneously formed with other layer structures. In addition, a size, a shape and a material of the protrusion are not limited in the embodiment of the present disclosure and can be determined according to an actual condition.

The display substrate provided by the embodiment of the present disclosure includes a base substrate, a pixel defining layer formed on the base substrate, and a light emitting layer located in a sub-pixel region defined by the pixel defining layer. The pixel defining layer includes a reflective layer, and the reflective layer is in the shape of protrusion towards a light outgoing side of the display substrate, and is configured such that light emitted from the light emitting layer to the reflective layer is reflected to the light outgoing side of the display substrate; in a region where the pixel defining layer is located, a portion from the reflective layer to the light outgoing side of the display substrate is transparent. The pixel defining layer further includes: a protrusion located in the region where the pixel defining layer is located, the reflective layer covers whole or part of the protrusion, and a first transparent part located above the reflective layer; and the light outgoing side of the display substrate is a surface of the display substrate away from the base substrate.

In the above embodiment, the light emitted from the light emitting layer to the reflective layer can be reflected by the reflective layer to the light outgoing side of the display substrate, and therefore a propagation path of this part of light is changed. On one hand, the light and color interference caused by this part of light on the adjacent sub-pixels is avoided; on the other hand, this part of light is further irradiated to the light outgoing side of the display substrate, so that this part of light can be effectively utilized again, and the light leak problem is effectively resolved. The above display substrate is applied into the display device, and the light outgoing efficiency and the color purity of the display device are both effectively improved.

Optionally, in order to facilitate manufacturing, a cross section of the protrusion can be in a shape of semiellipse, semicircle, triangle or trapezoid. The embodiment and the drawing of the present disclosure are both illustrated with that the cross section of the protrusion is in the shape of semiellipse as an example.

Optionally, referring to FIG. 2, the above display substrate further includes: a first transparent layer 51 located on the transparent base substrate 50, the protrusion 42 is formed on the first transparent layer 51, and the protrusion 42 and the first transparent layer 51 are of an integrated structure. In this way, the protrusion can be formed while the first transparent layer is formed, the number of times of patterning process is reduced, and cost is saved. It should be noted that, purpose and material of the first transparent layer are not limited in the embodiment of the present disclosure; for example, the first transparent layer can serve as a planarization layer to facilitate subsequent forming of other layer structures or thin films and certainly can also play other roles, which can be determined according to an actual condition.

Referring to FIG. 3 again, the display substrate includes: a transparent base substrate 50, a pixel defining layer 40' formed on the transparent base substrate 50, and a light emitting layer 20 located in a sub-pixel region P defined by the pixel defining layer 40', wherein, the pixel defining layer 40' includes: a reflective layer 41', and the reflective layer 41' is in the shape of protrusion towards a light outgoing side of the display substrate, and is configured such that light emitted from the light emitting layer to the reflective layer is reflected to the light outgoing side of the display substrate; the display substrate further includes a second transparent layer 52 located on the transparent base substrate 50; the second transparent layer 52 is formed with a first pixel defining part 42' in a region D where the pixel defining layer 40 is located; a groove T is formed on the first pixel defining part 42'; and the reflective layer 41' conformally covers whole or part of a surface of the groove T; the pixel defining layer 40' further includes: a second transparent part 44 located above the reflective layer 41' serves as a second pixel defining part. A bottom of the second transparent part 44 is filled in the groove T. The light outgoing side of the display substrate is the lower surface of the transparent base substrate.

In the above display substrate, the light outgoing side of the display substrate is the lower surface of the transparent base substrate, and then the display substrate can form an OLED display device of a bottom emitting structure.

In the above display substrate, a material of the second transparent layer 52 is not limited in the embodiment of the present disclosure, as long as that the second transparent layer is transparent. For example, the second transparent layer 52 can be formed by a transparent material such as light polymerizable resin or heat polymerizable resin or other transmissive materials. A purpose and the material of the second transparent layer 52 are not limited in the embodiment of the present disclosure. For example, the second transparent layer 52 can serve as a planarization layer to facilitate subsequent forming of other layer structures or thin films and certainly can also play other roles, which can be determined according to an actual condition. For example, the second transparent layer 52 is an insulating layer.

In the above display substrate, the reflective layer can cover whole of the groove to increase the reflectivity. A degree at which the reflective layer covers the groove is not limited in the embodiment of the present disclosure. In another embodiment, the reflective layer can cover part of a surface of the groove. The embodiment and the drawing of the present disclosure are both illustrated with that the reflective layer covers whole of the groove as an example.

In the above display substrate, the groove can be formed in various methods, which is not limited herein. For example, the groove can be simultaneously formed with other layer structures are formed. In addition, a size and a shape of the groove are not limited in the embodiment of the present disclosure and can be determined according to an actual condition.

The display substrate provided by the embodiment of the present disclosure includes a transparent base substrate, a pixel defining layer formed on the transparent base substrate, and a light emitting layer located in a sub-pixel region defined by the pixel defining layer. The pixel defining layer includes a reflective layer; the reflective layer is in the shape of protrusion towards a light outgoing side of the display substrate, and is configured such that light emitted from the light emitting layer to the reflective layer is reflected to the light outgoing side of the display substrate; in a region where the pixel defining layer is located, a portion from the reflective layer to the light outgoing side of the display substrate is transparent. The display substrate further includes: a second transparent layer located on the transparent base substrate, the second transparent layer is formed with a groove in the region where the pixel defining layer is located, and the reflective layer covers whole or part of the groove; the pixel defining layer further includes a second transparent part located above the reflective layer, and a bottom of the second transparent part is filled in the groove. The light outgoing side of the display substrate is a surface of the display substrate away from the transparent base substrate.

In this way, the light emitted from the light emitting layer to the reflective layer can be reflected by the reflective layer to the light outgoing side of the display substrate, and therefore a propagation path of this part of light is changed. On one hand, the light and color interference caused by this part of light on adjacent sub-pixels is avoided; on the other hand, this part of light is further irradiated to the light outgoing side of the display substrate, so that this part of light can be effectively utilized again, and the light leak problem is effectively resolved. The above display substrate is applied into the display device, and the light outgoing efficiency and the color purity of the display device are both effectively improved.

Optionally, in order to facilitate manufacturing, a cross section of the groove can be in a shape of semiellipse, semicircle, triangle or trapezoid. The embodiment and the drawing of the present disclosure are both illustrated with that the cross section of the protrusion is in the shape of semiellipse as an example.

An embodiment of the present disclosure provides a display device, the display device including the display substrate provided by any one of the above embodiments. The display device can be an OLED display or any other display device, and any product or part with a display function, including these display devices, such as a TV set, a digital camera, a mobile phone, and a tablet personal computer, and the display device has a high light outgoing efficiency and high color purity.

Figure 4:
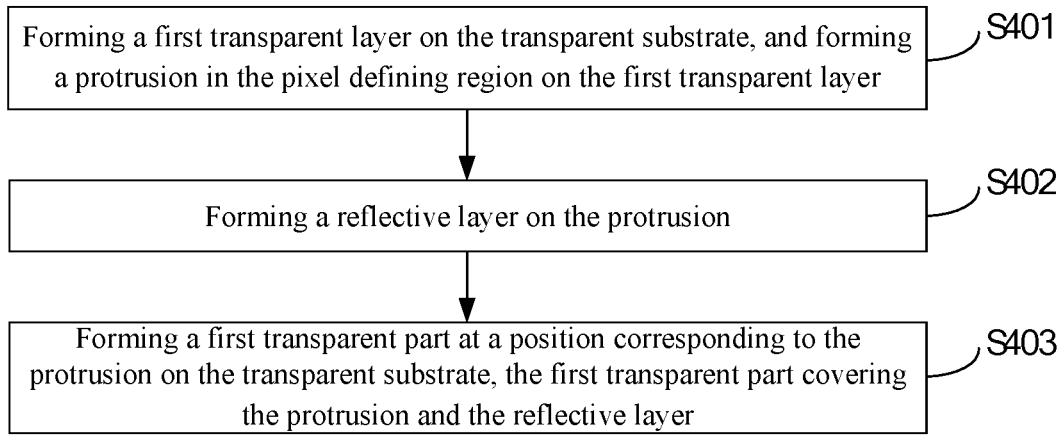
FIG. 4 is a flow diagram of a manufacturing method for the display substrate provided by an embodiment of the present disclosure.

An embodiment of the present disclosure provides a manufacturing method for the display substrate provided by the embodiment as shown in FIG. 2, and referring to FIG. 4, the method includes:

S401: forming a first transparent layer on a base substrate, and forming a first pixel defining part 42 above the first transparent layer and in a pixel defining region D, wherein, the first pixel defining part is formed as a protrusion towards a light outgoing side of the display substrate.

For example, the first transparent layer can serve as a planarization layer to facilitate subsequent forming of other layer structures or thin films.

S402: forming a reflective layer on the protrusion,

For example, a material of the reflective layer is metal, which, for example, can be copper, aluminum, silver and the like.

S403: forming a first transparent part at a position corresponding to the protrusion on the base substrate, the first transparent part covering the protrusion and the reflective layer.

For example, a forming material of the first transparent part can be light polymerizable resin or heat polymerizable resin or other transmissive materials.

Optionally, the first transparent layer and the protrusion can be formed by one patterning process; in this way, a number of times of patterning process can be reduced, and cost is saved. For example, the patterning process is a process to form a layer including at least one pattern from a thin film; the patterning process commonly includes: coating the thin film with a photoresist, the photoresist is subjected to exposure through a mask, photoresist needing to be removed is eroded away through developing liquid, then a thin film part not covered with the photoresist is etched away, and finally, remaining photoresist is stripped off. In all the embodiments of the present disclosure, one patterning process refers to a process forming a desired layer structure through one exposure.

Figure 5:
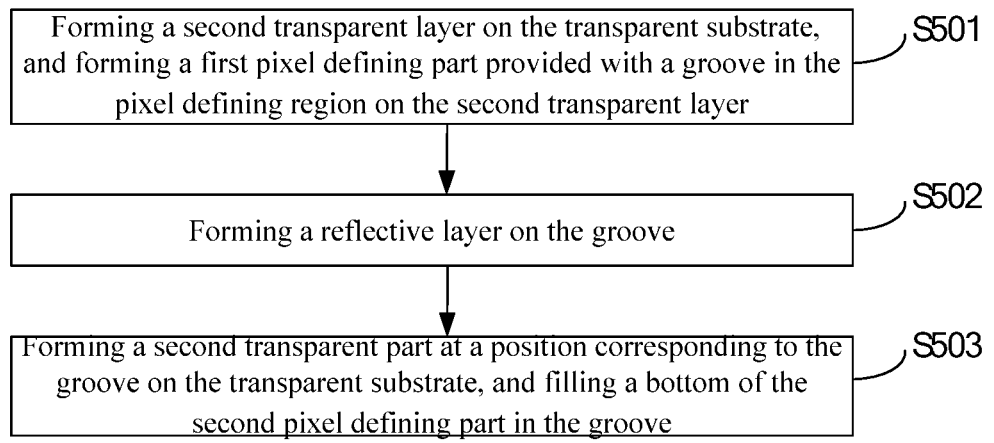
FIG. 5 is a flow diagram of a manufacturing method for another display substrate provided by an embodiment of the present disclosure.

The embodiment of the present disclosure provides a manufacturing method for the display substrate provided by the embodiment as shown in FIG. 3, and referring to FIG. 5, the method includes:

S501: forming a second transparent layer 52 on a transparent base substrate, and forming a first pixel defining part 42' in a pixel defining region D on the second transparent layer 52, wherein the first pixel defining part 42' is formed to be provided with a groove T.

For example, a forming material of the second transparent layer can be light polymerizable resin or heat polymerizable resin or other transmissive materials; the second transparent layer can serve as a planarization layer to facilitate subsequent forming of other layer structures or thin films.

S502: forming a reflective layer 41' on the groove T.

For example, a material of the reflective layer can be metal, which, for example, can be copper, aluminum, silver and the like.

S503: forming a second transparent part 44 on the reflective layer 41' to serve as a second pixel defining part, and a bottom of the second transparent part is filled in the groove.

For example, a forming material of the second transparent part 44 can be light polymerizable resin or heat polymerizable resin or other transmissive materials.

Optionally, the second transparent layer 44 and the groove T can be formed by one patterning process; in this way, a number of times of the patterning process can be reduced, and cost is saved. For example, the patterning process is a process to form a layer including at least one pattern from a thin film; the patterning process commonly includes: coating the thin film with photoresist, the photoresist is subjected to exposure through a mask, photoresist required to be removed is eroded away through developing liquid, then a thin film part not covered with the photoresist is etched away, and finally, remaining photoresist is stripped off. In all the embodiments of the present disclosure, one patterning process refers to a process forming a desired layer structure through one exposure.

Although the embodiment of the disclosure has been described above in great detail with general descriptions and specific embodiments, on the basis of the embodiment of the disclosure, various changes and improvements may be made, which is apparent to those skilled in the art. Therefore, all such changes and improvements without departing from the spirit of the disclosure are within the scope of the claims of the disclosure.

The present application claims priority of Chinese Patent Application No. 201510283539.7 filed on May 28, 2015, the present disclosure of which is incorporated herein by reference in its entirety as part of the present application.

The invention claimed is:

1. A display substrate, comprising: a base substrate, a pixel defining layer formed on the base substrate, and a light emitting layer located in a sub-pixel region defined by the pixel defining layer, wherein,
the pixel defining layer includes:
a reflective layer, configured such that light emitted from the light emitting layer to the reflective layer is reflected to a light outgoing side of the display substrate;
a first pixel defining part located below the reflective layer; and
a second pixel defining part located above the reflective layer,
wherein, the reflective layer is between the first pixel defining part and the second pixel defining part,
an orthographic projection of the light emitting layer on the base substrate has no overlapping region with an orthographic projection of the first pixel defining part on the base substrate,
the orthographic projection of the light emitting layer on the base substrate has no overlapping region with an orthographic projection of the second pixel defining part on the base substrate, and
the orthographic projection of the light emitting layer on the base substrate has no overlapping region with an orthographic projection of the reflective layer on the base substrate.

2. The display substrate according to claim 1, wherein, a portion of the pixel defining layer between the reflective layer and the light outgoing side is transparent.

3. The display substrate according to claim 1, wherein, the reflective layer protrudes towards the light outgoing side of the display substrate.

4. The display substrate according to claim 1, wherein, a material of the reflective layer is metal.

5. The display substrate according to claim 1, further comprising an anode layer and a cathode layer located in the sub-pixel region, and the light emitting layer is located between the anode layer and the cathode layer.

6. The display substrate according to claim 5, wherein, the reflective layer is physically and electrically separated from the anode layer, the cathode layer and the light emitting layer.

7. A display device, comprising the display substrate according to claim 1.

8. A manufacturing method for the display substrate according to claim 1, comprising:
forming the pixel defining layer in a pixel defining region on the base substrate so as to define the sub-pixel region on the base substrate; and
forming the light emitting layer in the sub-pixel region.

9. The manufacturing method according to claim 8, wherein, the forming the pixel defining layer in the pixel defining region on the base substrate so as to define the sub-pixel region on the base substrate, includes:
forming a transparent layer in the pixel defining region on the base substrate;
forming a first pixel defining part in a pixel defining region on the transparent layer, wherein, the first pixel defining part is formed as a protrusion towards the light outgoing side of the display substrate;
forming the reflective layer on the protrusion; and forming a transparent second pixel defining part above the reflective layer, the second pixel defining part covering the protrusion and the reflective layer.

10. The manufacturing method according to claim 9, wherein, a first transparent layer and the protrusion are formed by one patterning process.

11. A manufacturing method for a display substrate, comprising:
forming a pixel defining layer in a pixel defining region on a base substrate so as to define a sub-pixel region on the base substrate; and
forming a light emitting layer in the sub-pixel region,
wherein, the pixel defining layer is formed to include a reflective layer, and the reflective layer is configured such that light emitted from the light emitting layer to the reflective layer is reflected to a light outgoing side of the display substrate, wherein, the forming the pixel defining layer in the pixel defining region on the base substrate so as to define the sub-pixel region on the base substrate, includes:
forming a transparent layer on the base substrate;
forming a first pixel defining part in a pixel defining region on the transparent layer, wherein, the first pixel defining part is formed to be provided with a groove;
forming the reflective layer on the groove; and
forming a transparent second pixel defining part above the reflective layer, a bottom of the transparent second pixel defining part filling in the groove.

12. The manufacturing method according to claim 11, wherein, the transparent layer and the first pixel defining part with the groove are formed by one patterning process.

13. A display substrate, comprising: a base substrate, a pixel defining layer formed on the base substrate, and a light emitting layer located in a sub-pixel region defined by the pixel defining layer, wherein, the pixel defining layer includes: a reflective layer, configured such that light emitted from the light emitting layer to the reflective layer is reflected to a light outgoing side of the display substrate,
wherein, the pixel defining layer further includes: a first pixel defining part located below the reflective layer, and a second pixel defining part located above the reflective layer, wherein, the base substrate is transparent, and the light outgoing side of the display substrate is a lower surface of the base substrate; the first pixel defining part is formed to be provided with a groove, and the reflective layer conformally covers whole or part of a surface of the groove; and a bottom of the second pixel defining part is filled in the groove.

14. The display substrate according to claim 13, wherein, the light outgoing side of the display substrate is a surface of the display substrate away from the base substrate, the first pixel defining part is formed as a protrusion towards the light outgoing side of the display substrate, and the reflective layer conformally covers whole or part of a surface of the protrusion.

15. The display substrate according to claim 14, wherein, a cross section of the protrusion is in a shape of a semiellipse, a semicircle, a triangle or a trapezoid.

16. The display substrate according to claim 13, wherein, a cross section of the groove is in a shape of a semiellipse, a semicircle, a triangle or a trapezoid.

17. The display substrate according to claim 13, wherein, the first pixel defining part and the second pixel defining part are both transparent.

18. The display substrate according to claim 13, further comprising: a first transparent layer located on the base substrate, wherein the first pixel defining part is formed on the first transparent layer, and the first pixel defining part and the first transparent layer are of an integrated structure.

\* \* \* \* \*